(12) United States Patent
Dowling

(10) Patent No.: US 7,220,015 B2
(45) Date of Patent: *May 22, 2007

(54) INDICATION SYSTEMS AND METHODS

(75) Inventor: Kevin J. Dowling, Westford, MA (US)

(73) Assignee: Color Kinetics Incorporated, Boston, MA (US)

( * ) Notice: Subject to any disclaimer, the term of this patent is extended or adjusted under 35 U.S.C. 154(b) by 289 days.

This patent is subject to a terminal disclaimer.

(21) Appl. No.: 11/065,433

(22) Filed: Feb. 24, 2005

(65) Prior Publication Data

US 2005/0236029 A1    Oct. 27, 2005

Related U.S. Application Data

(63) Continuation of application No. 10/116,222, filed on Apr. 4, 2002, now Pat. No. 6,883,929.

(60) Provisional application No. 60/281,292, filed on Apr. 4, 2001.

(51) Int. Cl.
 *F21L 13/00* (2006.01)
 *H01L 35/30* (2006.01)

(52) U.S. Cl. ............ 362/192; 362/276; 136/205

(58) Field of Classification Search ........ 362/276, 362/802, 192, 800; 136/205
See application file for complete search history.

(56) References Cited

U.S. PATENT DOCUMENTS

| | | | |
|---|---|---|---|
| 5,288,336 A | 2/1994 | Strachan et al. | |
| 5,622,868 A | 4/1997 | Clarke et al. | |
| 5,921,087 A | 7/1999 | Bhatia et al. | |
| 6,016,038 A | 1/2000 | Mueller et al. | |
| 6,100,671 A * | 8/2000 | Kanesaka | 320/150 |
| 6,150,774 A | 11/2000 | Mueller et al. | |
| 6,166,317 A * | 12/2000 | Volk, Jr. | 136/201 |
| 6,166,496 A | 12/2000 | Lys et al. | |
| 6,211,626 B1 | 4/2001 | Lys et al. | |
| 6,292,901 B1 | 9/2001 | Lys et al. | |
| 6,340,868 B1 | 1/2002 | Lys et al. | |
| 6,459,919 B1 | 10/2002 | Lys et al. | |
| 6,528,954 B1 | 3/2003 | Lys et al. | |
| 6,548,967 B1 | 4/2003 | Dowling et al. | |
| 6,577,080 B2 | 6/2003 | Lys et al. | |
| 6,608,453 B2 | 8/2003 | Morgan et al. | |
| 6,624,597 B2 | 9/2003 | Dowling et al. | |
| 6,717,376 B2 | 4/2004 | Lys et al. | |
| 6,720,745 B2 | 4/2004 | Lys et al. | |
| 2001/0023591 A1 | 9/2001 | Maeda et al. | |
| 2002/0038157 A1 | 3/2002 | Dowling et al. | |
| 2002/0044066 A1 | 4/2002 | Dowling et al. | |
| 2002/0047569 A1 | 4/2002 | Dowling et al. | |
| 2002/0048169 A1 | 4/2002 | Dowling et al. | |
| 2002/0057061 A1 | 5/2002 | Mueller et al. | |

(Continued)

FOREIGN PATENT DOCUMENTS

JP    P2002-78367 A    3/2002

*Primary Examiner*—Ali Alavi
(74) *Attorney, Agent, or Firm*—Wolf, Greenfield & Sacks, P.C.

(57) ABSTRACT

Thermal indication methods and systems. In one example, electrical power is generated based on a temperature of a thermal surface, and at least one indication is provided, based on the generated electrical power, representative of the temperature of the thermal surface.

2 Claims, 4 Drawing Sheets

U.S. PATENT DOCUMENTS

| | | |
|---|---|---|
| 2002/0070688 A1 | 6/2002 | Dowling et al. |
| 2002/0074559 A1 | 6/2002 | Dowling et al. |
| 2002/0078221 A1 | 6/2002 | Blackwell et al. |
| 2002/0101197 A1 | 8/2002 | Lys et al. |
| 2002/0130627 A1 | 9/2002 | Dowling et al. |
| 2002/0145394 A1 | 10/2002 | Morgan et al. |
| 2002/0145869 A1 | 10/2002 | Dowling |
| 2002/0152045 A1 | 10/2002 | Dowling et al. |
| 2002/0153851 A1 | 10/2002 | Dowling et al. |
| 2002/0158583 A1 | 10/2002 | Lys et al. |
| 2002/0163316 A1 | 11/2002 | Dowling et al. |
| 2002/0171365 A1 | 11/2002 | Morgan et al. |
| 2002/0171377 A1 | 11/2002 | Mueller et al. |
| 2002/0171378 A1 | 11/2002 | Morgan et al. |
| 2002/0176259 A1 | 11/2002 | Ducharme |
| 2002/0195975 A1 | 12/2002 | Dowling et al. |
| 2003/0011538 A1 | 1/2003 | Lys et al. |
| 2003/0028260 A1 | 2/2003 | Blackwell |
| 2003/0057884 A1 | 3/2003 | Dowling et al. |
| 2003/0057886 A1 | 3/2003 | Lys et al. |
| 2003/0057887 A1 | 3/2003 | Dowling et al. |
| 2003/0057890 A1 | 3/2003 | Lys et al. |
| 2003/0076281 A1 | 4/2003 | Morgan et al. |
| 2003/0100837 A1 | 5/2003 | Lys et al. |
| 2003/0133292 A1 | 7/2003 | Mueller et al. |
| 2003/0137258 A1 | 7/2003 | Piepgras et al. |
| 2003/0222587 A1 | 12/2003 | Dowling et al. |
| 2004/0032226 A1 | 2/2004 | Lys |
| 2004/0036006 A1 | 2/2004 | Dowling |
| 2004/0052076 A1 | 3/2004 | Mueller et al. |
| 2004/0090191 A1 | 5/2004 | Mueller et al. |
| 2004/0090787 A1 | 5/2004 | Dowling et al. |
| 2004/0105261 A1 | 6/2004 | Ducharme et al. |
| 2004/0113568 A1 | 6/2004 | Dowling et al. |
| 2004/0116039 A1 | 6/2004 | Mueller et al. |
| 2004/0130909 A1 | 7/2004 | Mueller et al. |
| 2004/0178751 A1 | 9/2004 | Mueller et al. |
| 2004/0212320 A1 | 10/2004 | Dowling et al. |
| 2004/0212321 A1 | 10/2004 | Lys et al. |
| 2004/0212993 A1 | 10/2004 | Morgan et al. |
| 2004/0240890 A1 | 12/2004 | Lys et al. |
| 2004/0257007 A1 | 12/2004 | Lys et al. |

* cited by examiner

INDICATION SYSTEMS AND METHODS

CROSS REFERENCE TO RELATED APPLICATION

This application claims the benefit under 35 U.S.C. §120 as a continuation (CON) of U.S. Non-provisional application Ser. No. 10/116,222, filed Apr. 4, 2002 now U.S. Pat. No. 6,883,929, entitled "Indication Systems and Methods," which in turn claims the benefit of U.S. Provisional Application Ser. No. 60/281,292, filed Apr. 4, 2001, entitled "LED Based Illumination Systems and Methods."

FIELD OF THE INVENTION

The present invention generally relates to indication systems and methods based on alternative power generation.

DESCRIPTION OF RELATED ART

Thermo-electric devices have been used to provide electricity where conventional power sources are impractical, difficult to employ or not available. The principle of generating electricity using temperature differences is established through the Seebeck Effect. There have been applications of the Seebeck effect for heat driven fans to circulate air from woodstoves and to generate electricity for rural areas in the same manner. Thermo-electric devices convert heat directly into electricity through the Seebeck effect. For power generation, the Seebeck effect produces an electric current or voltage in a circuit made of two different conducting materials if the two junctions are held at different temperatures.

SUMMARY OF THE INVENTION

One embodiment of the present invention is directed to an indication system for a thermal surface. The system comprises at least one indicator and at least one power source coupled to the at least one indicator and the thermal surface. The power source provides electrical power to the indicator based on a temperature of the thermal surface, such that the indicator provides at least one indication representative of the temperature of the thermal surface.

Another embodiment of the invention is directed to a thermal indication method, comprising steps of generating electrical power based on a temperature of a thermal surface, and providing at least one indication, based on the generated electrical power, representative of the temperature of the thermal surface.

Another embodiment of the present invention is directed to a lighting system. The lighting system may comprise a Seebeck power generator and at least one LED electrically associated with the Seebeck power generator. The lighting system may be used in conjunction with a heated surface as an indicator of the hot surface. In one aspect, the lighting system may be energized through the Seebeck power generator.

Another embodiment of the present invention is directed to method for generating an information signal. The method comprises the steps of (A) electrically associating at least one LED with a Seebeck power generator; (B) thermally associating the Seebeck power generator with a surface; and (C) heating the surface to cause the Seebeck power generator to generate electricity to energize the at least one LED. In one aspect, such a method may be used to provide an indication of the temperature of a surface.

BRIEF DESCRIPTION OF THE FIGURES

The following figures depict certain illustrative embodiments of the invention in which like reference numerals refer to like elements. These depicted embodiments are to be understood as illustrative of the invention and not as limiting in any way.

DETAILED DESCRIPTION

Figure 1:
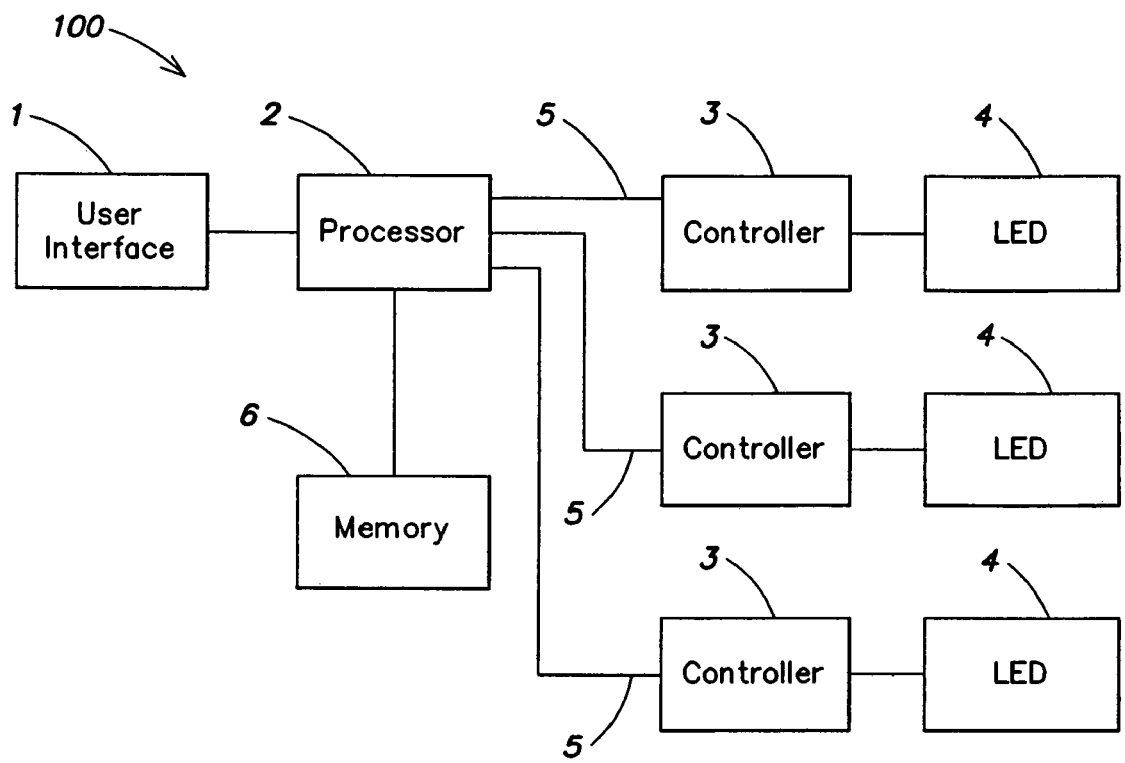
FIG. 1 depicts a block diagram of a system according to one embodiment of the invention.

The description below pertains to several illustrative embodiments of the invention. Although many variations of the invention may be envisioned by one skilled in the art, such variations and improvements are intended to fall within the compass of this disclosure. Thus, the scope of the invention is not to be limited in any way by the disclosure below.

One embodiment of the present invention generally relates to systems and methods that provide one or more perceptible indications (e.g., illumination, light, sound, warning signals, information signals or the like) through the use of alternative energy generation (e.g. Seebeck power generation). For example, a system according to one embodiment of the present invention may comprise one or more indicators in electrical association with a Seebeck power generator. The electrical association may be such that the one or more indicators become energized when the Seebeck power generator generates sufficient electrical power. In one aspect of this embodiment, based on the Seebeck power generator being responsive to heat, the indicator may provide an indication representative of a thermal condition.

In another embodiment of the present invention, one or more various types of illumination sources (e.g., one or more LEDs) may be associated with a Seebeck device in an illumination system. In one aspect of this embodiment, the Seebeck device is thermally coupled to a heated surface, and the system is adapted such that the light emitted from the system changes in color and/or intensity as the temperature of the heated surface changes. The light from such a system may be modulated in many ways, including changing intensity, color, temporal patterns, strobing light to steady state effects or the like. In another aspect, the system may be arranged to energize and de-energize the light source without generating other effects. In yet another aspect, the LED(s) may be regulated through the use of a processor, wherein the processor is associated with a Seebeck device.

Applicants have appreciated and recognized a number of useful applications for at least one embodiment of a thermally responsive indication system according to the present invention. For example, as well-known, it is generally accepted that hot surfaces can be dangerous. In particular, hot irons, teakettles, and cooking surfaces present a risk of danger, especially to children who may not be aware that a device is on or is hot. Burns can occur quickly and can cause severe physical and emotional trauma. Accordingly, Applicants have appreciated that it would be useful to provide a warning system for use with hot surfaces to warn of the hot surface.

Hence, a system according to one embodiment of the present invention may be used as a warning device to warn of the presence of a heated surface. For example, a stove may have a heated surface sufficient to burn the skin; however, the surface may not visually appear hot. A system according to the principles of the present invention may be associated with the surface of the stove and may generate one or more indicators (e.g., light) to warn of the heated surface.

In particular, in one aspect of this embodiment, a lighting system may emit a color within a color range, and the color may depend on the temperature of a heated surface. For example, as the surface heats up, the light may change from red to orange, to white and finally to blue. This pattern may repeat in reverse order as the surface cools down. The color changing effect may be interpreted as an indication of the temperature of the surface.

Following below are more detailed descriptions of various concepts related to, and embodiments of, indication methods and apparatus according to the present invention. It should be appreciated that various aspects of the invention, as discussed above and outlined further below, may be implemented in any of numerous ways as the invention is not limited to any particular manner of implementation. Examples of specific implementations are provided for illustrative purposes only.

FIG. 1 illustrates a block diagram of a system 100 according to one embodiment of the invention. A processor 2 is associated with one or more controller(s) 3. The controller(s) 3 control power provided to one or more LEDs 4, based on one or more signals 5 provided by the processor 2. As used herein, the term processor may refer to any system for processing electronic signals. For example, a processor may include a microprocessor, microcontroller, programmable digital signal processor, other programmable device, a controller, addressable controller, addressable microprocessor, computer, programmable processor, programmable controller, dedicated processor, dedicated controller, integrated circuit, control circuit or other processor. A processor may also, or instead, include an application specific integrated circuit, a programmable gate array, programmable array logic, a programmable logic device, a digital signal processor, an analog-to-digital converter, a digital-to-analog converter, or any other device that may be configured to process electronic signals. In addition, a processor may include discrete circuitry such as passive or active analog components including resistors, capacitors, inductors, transistors, operational amplifiers, and so forth, as well as discrete digital components such as logic components, shift registers, latches, or any other separately packaged chip or other component for realizing a digital function.

Any combination of the above circuits and components, whether packaged discretely, as a chip, as a chipset, or as a die, may be suitably adapted to use as a processor as described herein. It will further be appreciated that the term processor may apply to an integrated system, such as a personal computer, network server, or other system that may operate autonomously or in response to commands to process electronic signals such as those described herein. Where a processor includes a programmable device such as the microprocessor or microcontroller mentioned above, the processor may further include computer executable code that controls operation of the programmable device. In one embodiment, the processor 2 is Microchip PIC processor 12C672 and the LEDs 4 may be red, green and blue, respectively.

In the embodiment of FIG. 1, a given controller 3 may be a pulse width modulator, pulse amplitude modulator, pulse displacement modulator, resistor ladder, current source, voltage source, voltage ladder, switch, transistor, voltage controller, or other controller. The controller controls the current, voltage or power applied to one or more LEDs 4. The controller may also have a signal input wherein the controller is responsive to a signal 5 received by the signal input. The signal input is associated with the processor such that the processor communicates signal(s) 5 to the signal input and the controller regulates the current, voltage and or power applied to one or more LEDs. For example, the controller may include one or more switches (e.g. one or more transistors), and the switch(es) may be associated with the LED(s) such that the processor effectively controls an intensity or brightness of the LED(s). In one embodiment, a controller is not a necessary element, as the processor may control one or more LEDs directly.

In one embodiment, several LEDs with different spectral output (i.e., different colors) may be used in the system of FIG. 1. In one aspect, each of these colors may be driven through separate controllers. In yet another aspect, the processor and controller(s) may be incorporated into one device. This device may have power capabilities to drive one or more LEDs. The processor and controller may also be separate devices. By controlling the LEDs independently, a great range of color mixing can be achieved for the creation of lighting effects. Electronic memory 6 may also be provided. In one aspect, the memory 6 is capable of storing algorithms, tables, or values associated with the control signals. The memory 6 may store programs for controlling the one or more LEDs 4. The memory may be read-only memory, programmable memory, programmable read-only memory, erasable programmable read-only memory, electronically erasable programmable read-only memory, random access memory, dynamic random access memory, double data rate random access memory, Rambus direct random access memory, flash memory, or any other volatile or non-volatile memory for storing program instructions, program data, address information, and program output or other intermediate or final results. A program, for example, may store control signals to operate several different colored LEDs 4.

A user interface 1 may also be associated with the system of FIG. 1. The user interface may be used to select a program from memory, modify a program from memory, modify a program parameter from memory, modify the LED output, select an external signal or provide other user interface solutions. Several methods of color mixing and pulse width modulation control are disclosed in U.S. Pat. No. 6,016,038 "Multicolored LED Lighting Method and Apparatus," hereby incorporated herein by reference. The processor 2 can also be addressable to receive programming signals addressed to it.

One example of a user interface is an interface that includes one or more elements associated with a power source. For example, the user interface may include one or more energy storage elements associated with a power source. In one aspect, the energy storage element(s) can also be associated with a processor. The energy storage element(s) may include one or more capacitors, non-volatile memory, battery backed memory, relay(s), storage device(s), battery(ies), rechargeable battery(ies), or other types of energy storage element(s).

In one embodiment, the energy storage element(s) may communicate a logic high and a logic low signal to the processor of FIG. 1 depending on the state of the element(s). For example, the element(s) may communicate a low logic signal when the system 100 is connected to the power source and a high logic signal when the system 100 is disconnected from the power source. The high logic signal may change to a low logic signal following a predetermined period of time and the processor may be monitoring the signal. The system 100 could be programmed such that a last lighting program may be operating when the system is de-energized. If the system is re-energized within a predetermined period, while the logic signal is still high, the system may select a new program from memory to execute. If the system is not re-energized within the predetermined period, the system may start up in the last lighting program or a default program. A non-volatile memory, battery backed memory or other memory may be provided such that the last program is remembered. The technique can be used to change the program, a program parameter or other setting. This technique can be used in a device that does not include a separate user interface by turning the power to the lighting device off and on. A separate switch could also be employed to provide the user interface as well as an on/off switch.

Figure 2:
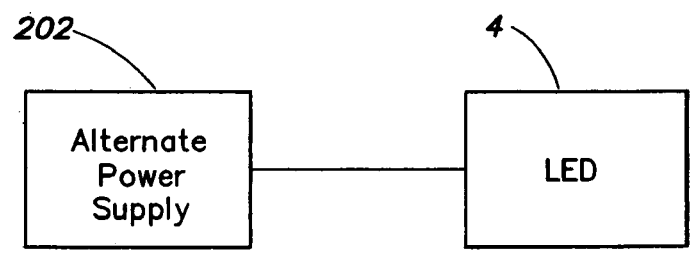
FIG. 2 depicts a block diagram of a system according to one embodiment of the invention.

FIG. 2 illustrates a block diagram of a system according to one embodiment of the invention. An alternate power supply 202 is associated with one or more LED(s) 4. For example, with reference again to FIG. 1, in one embodiment, the alternative power supply 202 of FIG. 2 may be used to provide power to one or more of the processor 2, memory 6, and controller(s) 3. In various embodiments, the alternate power supply 202 could be a Seebeck device, wind-powered power supply, water-powered power supply, solar-powered power supply or other power supply.

In the system of FIG. 2, the LED 4 may be energized when the alternative power supply generates enough voltage such that the LED begins to conduct current. As in FIG. 1, a processor 2 may optionally be associated with the alternative power supply and the LED. The processor may control the power distributed to the LED for example. The processor may communicate signals to the LED such that the LED flashes, energizes, produces high output, produces low output, or generates other illumination conditions based on the power generated by the alternate power supply 202. In one aspect, a boost converter also may be used to boost a voltage generated by the Seebeck power generator so as to supply the LED and or the processor with appropriate power.

In one particular embodiment of a system according to the principles of the invention in which the alternate power supply 202 is a Seebeck device, the system may be employed as a thermal indication system. For example, in one embodiment, the Seebeck device could be associated with any surface that may undergo a temperature change such as, for example, a surface of an iron (FIG. 5), clothes iron, stove, stove top, stove burner, stove pipe, chimney, glass stove top, oven, wood burning stove, gas burning stove, coal burning stove, electric stove, metal surface, teakettle, pot, radiator, hairdryer, glass surface, synthetic surface, plastic surface or other surface. The surface may undergo a temperature change resulting in the Seebeck device generating electricity. In various embodiments, such a system may be used in a residential, industrial, commercial, or other settings.

For example, in one embodiment, the LED(s) 4 shown in FIG. 1 or 2 may be energized when the surface temperature exceeds a predetermined or user-defined threshold, and the LED(s) may be de-energized when the surface temperature falls below this threshold. This may be very useful for providing a warning system. In particular, it is often difficult to tell when objects are hot because there is no visible evidence of the high temperature. For example, the visual appearance of the hot plate of an iron does not change based on temperature. In another example, the heating element of an electric stove rapidly reverts to its room-temperature color after it is turned off, even though its temperature may remain dangerously high after shut-off. Systems and methods according to the present invention could be used to provide one or more indications that serve as a warning signal in such circumstances.

Figure 5:
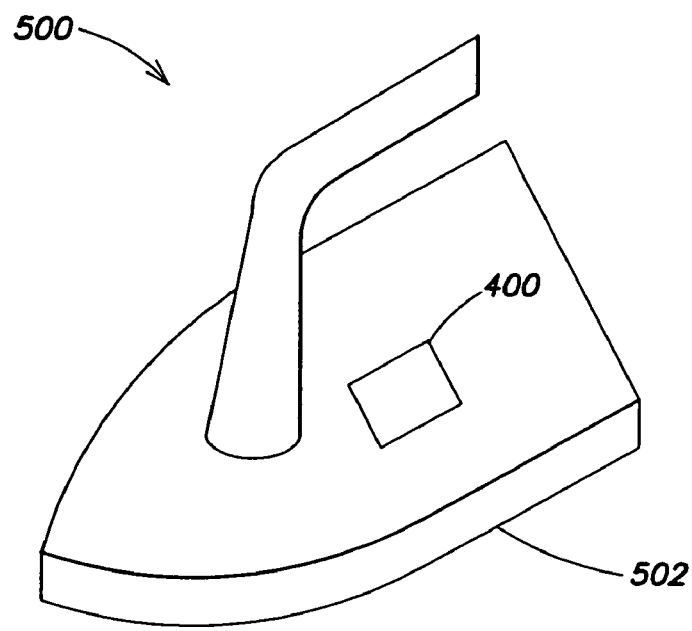
FIG. 5 illustrates a system according to one embodiment of the invention.

For example, a thermal indication device or system according to the principles of the invention could be included in an iron 500, as illustrated in FIG. 5. The Seebeck device could be associated with the hot plate 502 of the iron and one or more a LED(s) may be energized when the hot plate gets hot. The LED(s) may continue to illuminate even after the iron is unplugged because the Seebeck device may still be generating electricity until the hot plate cools down.

Alternatively, such a system may be used to alert a user that a normally warm or hot surface has cooled below its expected temperature. For example, a system comprising a Seebeck device as alternate power supply 202 may be deployed in contact with a furnace. A furnace is normally above ambient temperature during operation. During normal operation of the furnace, the LED(s) 4 may be illuminated using power supplied by the Seebeck device. This may provide an easily visualized cue that the furnace is working properly. If, however, the furnace fails and its temperature drops, the Seebeck device may stop producing sufficient power to illuminate the LED(s) 4. The LED(s) 4 could then turn off and thus provide a visible indication that the furnace is not working.

The LED(s) 4 may be located at any distance from the Seebeck device so long as some type of electrical connection is provided, such as wire, cable, network, electromagnetic, radio frequency, infrared, microwave or other connection known to one of skill in the art. In an exemplary embodiment, the Seebeck device may be attached to a furnace in a house, and the LED(s) 4 may be positioned, for example, near a window of the house or in a remote monitoring facility. In an embodiment, knowledge as to the status of the furnace may be obtained without having to enter the house.

Figure 8:
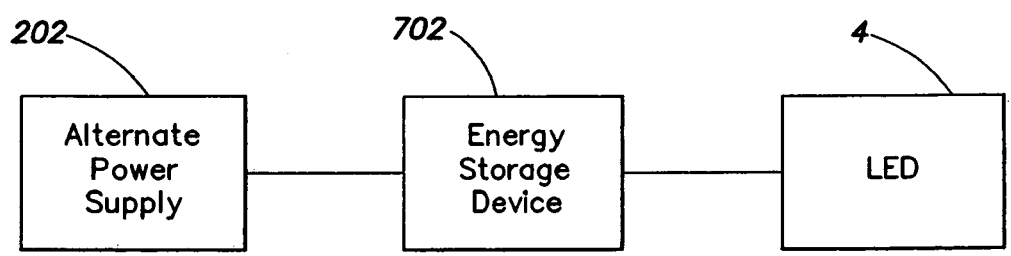
FIG. 8 shows a block diagram of a system according to one embodiment of the invention.

The Seebeck device optionally also may be associated with an energy storage device 802 such that the Seebeck device charges the energy storage device, as illustrated in FIG. 8. An energy storage device could also be associated with a conventional power supply to charge while the conventional power supply is available. The energy storage device may be a rechargeable battery, a capacitor, an energy storage circuit, or other energy storage device. The energy storage device may be used to smooth voltages and provide for clean power to the system, continued activity of the system after the alternative power supply has stopped producing power, or other reasons.

For example, it may be desirous to prolong the duration of a warning signal beyond the time that a Seebeck device is capable of generating power. This may be done to provide an additional "safety margin" to the warning duration. The energy storage device could then be used to continue the flow of electricity through the system for a period of time. The period of time could be determined from a pre-determined period of time, from a voltage feedback, or from other information. The system may monitor the rate of temperature decay, directly or indirectly, calculate the time required to achieve a low temperature state, and then keep the system on for that period of time. The energy storage device 802 may be wired in series with the Seebeck device or in parallel with the Seebeck device.

Figure 3:
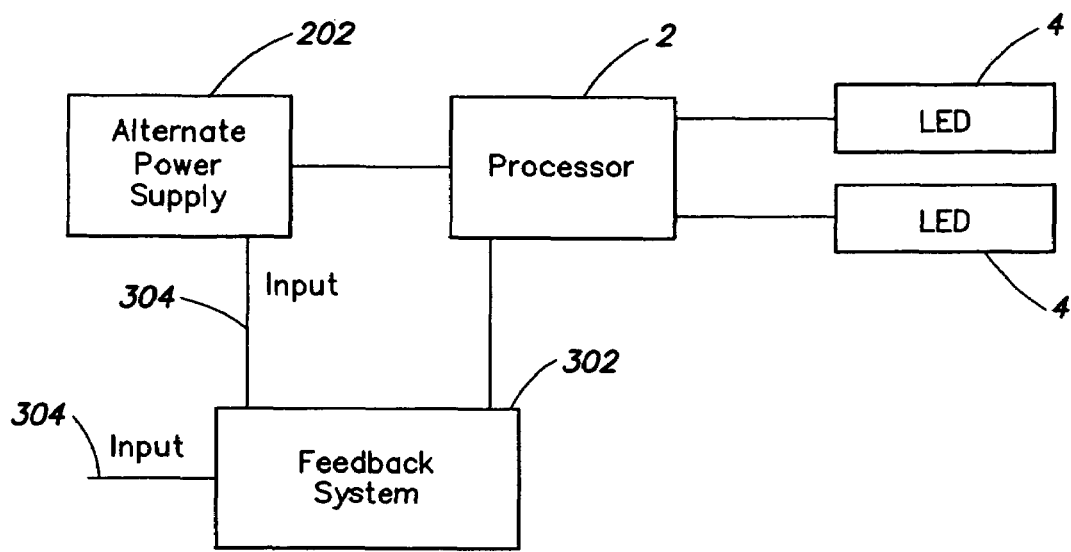
FIG. 3 depicts a block diagram of a system according to one embodiment of the invention.

A system according to one embodiment of the invention optionally may include a feedback system 302, as illustrated in FIG. 3. The feedback system may provide feedback information from the alternate power supply to the processor, for example. The feedback system may also provide feedback information from other sources. For example, the feedback device 302 may communicate voltage information from the alternative power supply 202 to a processor 2. The processor may then regulate the illumination conditions produced by the LED(s) 4 to correspond with the voltage. The intensity of the LED(s) 4, for example, could be regulated to increase as the voltage from the alternative power supply 202 increases. With a Seebeck device, this could correspond to a system that increases in brightness as the temperature of the surface increases. The system may also be arranged to energize a first LED when a first voltage level is produced and a second LED when a second voltage is produced.

A system according to another embodiment of the invention could include two or more different colored LEDs. The LEDs could be selectively energized to produce combined colors or other illumination effects. This technique could be used to generate different colors to correspond to the feedback information from the feedback system 302. A system using a Seebeck device could change colors as a surface begins to heat-up. In one embodiment, the colors could change from a warm orange, to red and then become white or blue indicating the surface has become very hot.

Figure 4:
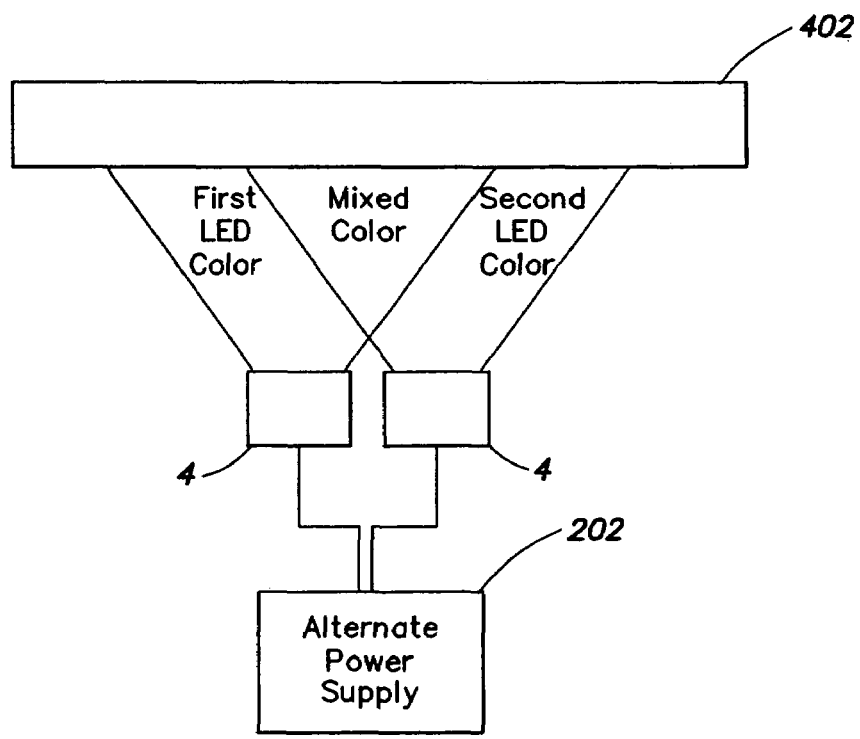
FIG. 4 illustrates a color mixing system according to one embodiment of the invention.

With reference to FIG. 4, light produced from two or more LEDs 4 may be projected onto or through a material 402 having a surface. The light projected from the LEDs 4 onto or through the surface may create the effect that the surface color has changed or the surface has been illuminated as illustrated in FIG. 4. The material may be a translucent material, etched material, semi-translucent material, transparent material, colored material or other material known to one of ordinary skill in the art. The LEDs 4 may be powered by an alternate power source 202, which may comprise a Seebeck device. The material 402 may appear to be changing colors as, for example, the temperature of a surface changes.

Figure 5A:
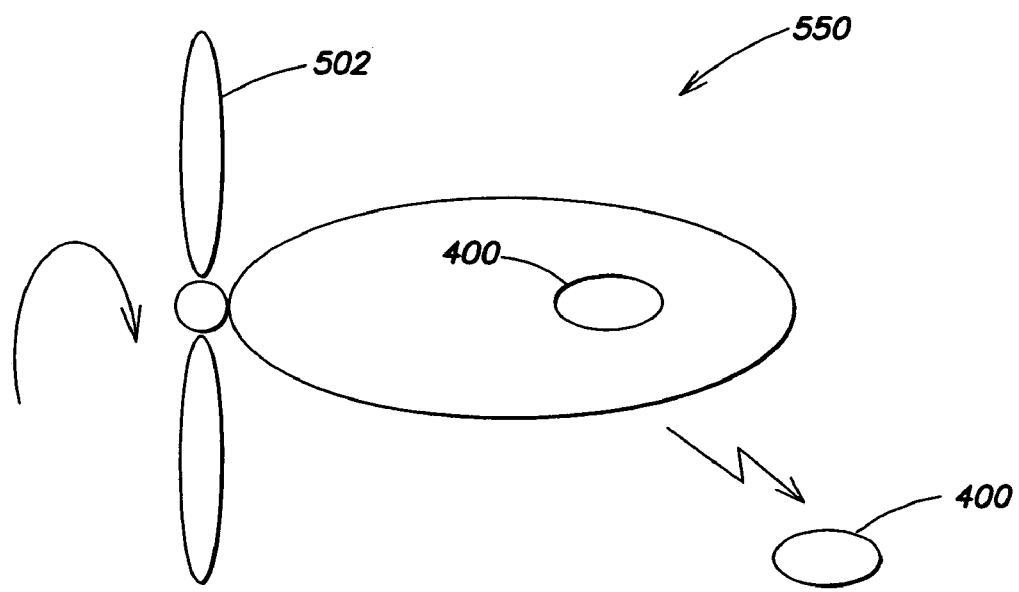

With reference to FIG. 5A, another embodiment may comprise a weathervane 550. The weathervane 550 may have an alternate power supply which comprises a propeller 502 generating power resulting from rotation driven by wind. The propeller 502 may provide power and thus energize one or more LEDs that may be arrayed in an LED system 400. The LED system 400 may be attached to the weathervane 550 or could be remotely located from the weathervane 550. This could be accomplished through wire, cable, network, electromagnetic, radio frequency, infrared, microwave or other communications methods known to one of ordinary skill in the art. In an embodiment, the LED intensity could increase as the wind speed increases. The LED system 400 could include several LEDs of different colors and the color emitted from the system 400 could represent information. The information may be wind speed, voltage, wind velocity, wind direction, air temperature or other information. The information does not need to relate to the weathervane or the system the LED system 400 is associated with. The information could be from any source.

Figure 6:
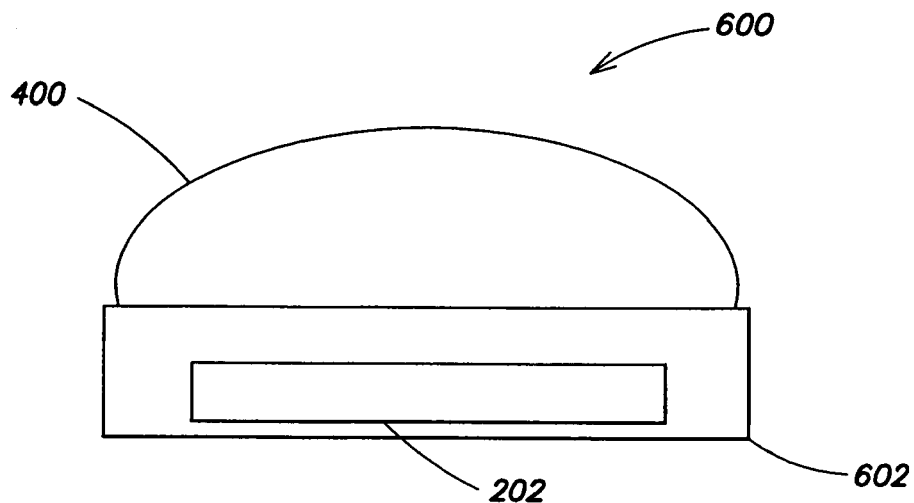
FIG. 6 illustrates a system according to one embodiment of the invention.

In another embodiment, a system according to the principles of the present invention may be a portable warning device 600, as illustrated in FIG. 6. The portable warning device may be associated with a platform 602 and the platform may be associated with a magnet, hook, hanger or other attachment device. This device may take the form of a puck or similar small disk for example and be portable to allow the user to easily transfer the warning device from place to place. The portable warning device may include an alternate power supply 202. The alternate power supply 202 may be a Seebeck device and the Seebeck device may be associated with one or more LEDs in the LED system 400. This device could be useful in warning about hot surfaces such as an iron, clothes iron, stove, stove top, stove burn, stove pipe, chimney, glass stove top, oven, wood burning stove, gas burning stove, coal burning stove, electric stove, metal surface, teakettle, pot, radiator, hairdryer, glass surface, synthetic surface, plastic surface or other surface. As a portable device, it could be placed on the burner of a gas stove for example and the warning device could remain lit until the burner cooled to an appropriate temperature. This device could be placed on any potentially hot surface and create a warning device that does not need batteries, and has no moving parts for example. The device may also be used to monitor a surface that is expected to be warm or hot, and to alert a user, by LED de-energizing, should the surface temperature fall below a preselected or user-determined threshold.

Figure 7:
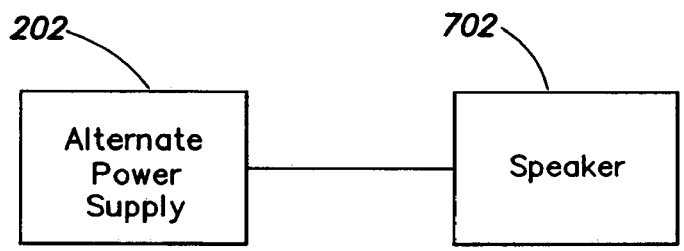
FIG. 7 illustrates a system according to one embodiment of the invention.

In many of the examples, an LED or LED system has been used to create feedback to a user. However, it should be appreciated that other types of conventional illumination sources may be used. Additionally, the feedback can also be achieved through other types of visible indication, aural indication, tactile indication, olfactory indication, or any combination of the foregoing. For example, an alternative power supply 202 could be associated with a speaker 702, as illustrated in FIG. 7. The speaker may be a sound card, digital to analog converter, sound system or other device to communicate to a user. The system could be arranged to provide sound feedback, when, for example, a surface gets hot. The sound feedback may be in the form of tones, music, alarm sounds or other sound feedback.

As used herein, the term "LED" means any system that is capable of receiving an electrical signal and producing a color of light in response to the signal. Thus, the term "LED" is understood to include light emitting diodes of all types, light emitting polymers, semiconductor dies that produce light in response to current, organic LEDs, electro-luminescent strips, and other such systems. In an embodiment, an "LED" may refer to a single light emitting diode having multiple semiconductor dies that are individually controlled. It is also understood that the term "LED" does not restrict the package type of the LED. The term "LED" includes packaged LEDs, non-packaged LEDs, surface mount LEDs, chip on board LEDs and LEDs of other configurations. The term "LED" also includes LEDs packaged or associated with phosphor wherein the phosphor may convert energy from the LED to a different wavelength.

An LED system is one type of illumination source. As used herein "illumination source" is understood to include all illumination sources, including LED systems, as well as incandescent sources, including filament lamps, pyro-luminescent sources, such as flames, candle-luminescent sources, such as gas mantles and carbon arch radiation sources, as well as photo-luminescent sources, including gaseous discharges, fluorescent sources, phosphorescence sources, lasers, electro-luminescent sources, such as electro-luminescent lamps, light emitting diodes, and cathode luminescent sources using electronic satiation, as well as miscellaneous luminescent sources including galvano-luminescent sources, crystallo-luminescent sources, kine-luminescent sources, thermo-luminescent sources, triboluminescent sources, sonoluminescent sources, and radioluminescent sources. Illumination sources may also include luminescent polymers capable of producing primary colors.

The term "illuminate" is understood to refer to the production of a frequency of radiation by an illumination source. The term "color" is understood to refer to any frequency of radiation within a spectrum; that is, a "color," as used herein, is understood to encompass frequencies not only of the visible spectrum, but also frequencies in the infrared and ultraviolet areas of the spectrum, and in other areas of the electromagnetic spectrum.

As used herein the term "alternate power supply" includes devices that supply power produced through the Seebeck effect, wind power, solar power, mechanical power, flywheels, compressed gas, springs, elastic storage and other power sources.

All articles, patents, and other references set forth above are hereby incorporated by reference. While the invention has been disclosed in connection with the embodiments shown and described in detail, various equivalents, modifications, and improvements will be apparent to one of ordinary skill in the art from the above description.

What is claimed is:

1. An indication system for a thermal surface, comprising:
   at least one indicator; and
   at least one power source coupled to the at least one indicator and the thermal surface, the at least one power source providing electrical power to the at least one indicator based on a temperature of the thermal surface, such that the at least one indicator provides at least one indication representative of the temperature of the thermal surface.

2. A thermal indication method, comprising steps of:
   generating electrical power based on a temperature of a thermal surface; and
   providing at least one indication, based on the generated electrical power, representative of the temperature of the thermal surface.

* * * * *

UNITED STATES PATENT AND TRADEMARK OFFICE
CERTIFICATE OF CORRECTION

PATENT NO. : 7,220,015 B2  Page 1 of 1
APPLICATION NO. : 11/065433
DATED : May 22, 2007
INVENTOR(S) : Kevin J. Dowling It is certified that error appears in the above-identified patent and that said Letters Patent is hereby corrected as shown below:

On the title page, item (*) Notice:

"This patent is subject to a terminal disclaimer." is deleted.

Signed and Sealed this

Fifteenth Day of July, 2008

JON W. DUDAS
*Director of the United States Patent and Trademark Office*